United States Patent [19]

Moustakas

[11] Patent Number: 5,385,862
[45] Date of Patent: Jan. 31, 1995

[54] METHOD FOR THE PREPARATION AND DOPING OF HIGHLY INSULATING MONOCRYSTALLINE GALLIUM NITRIDE THIN FILMS

[75] Inventor: Theodore D. Moustakas, Dover, Mass.

[73] Assignee: Trustees of Boston University, Mass.

[21] Appl. No.: 113,964

[22] Filed: Aug. 30, 1993

Related U.S. Application Data

[63] Continuation of Ser. No. 670,692, Mar. 18, 1991, abandoned.

[51] Int. Cl.⁶ .................... H01L 21/00; H01L 21/02; H01L 21/203
[52] U.S. Cl. .................... 437/107; 148/DIG. 113
[58] Field of Search .................... 437/105, 107; 148/DIG. 113

[56] References Cited

U.S. PATENT DOCUMENTS 4,144,116  3/1979  Jacob et al. .................... 437/965
4,792,467  12/1988  Melas et al. .................... 427/255

FOREIGN PATENT DOCUMENTS 2-143420  6/1990  Japan .

OTHER PUBLICATIONS

"Growth of Cubic GaN Films on (100) Si by ECR Assisted MBE", T. Lei et al., Bulletin of the American Physical Society, 36 No. 3 (Mar., 1991).

"Growth of GaN Films on the a-plane of Sapphire by ECR Assisted MBE", G. Merion et al., Bulletin of the American Physical Society, 36 No. 3 (Mar., 1991).

"Growth of Single Crystalline GaN Films on the R—plane of Sapphire by ECR Assisted", C. R. Eddy et al., Bulletin of the American Physical Society, 36 No. 3 (Mar., 1991).

"Electron Beam Effects on Blue Luminescence of Zinc-Doped GaN", Hiroshi Amano et al., 40 and 41, pp. 121–122 (Feb., 1988).

"Commercialization of GaN Blue LED with The Highest Reported Light Intensity in The World", unknown author, Japanese R&D Trend Analysis, 33 (Jan., 1991).

"Stimulated Emission Near Ultraviolet at Room Temperature from a GaN Film on Sapphire by MOVPE Using an AlN Buffer Layer," Hiroshi Amano, Feb. 1990, pp. L205–L206.

Sitar, Z., Design and performance of an electron cyclotron resonance plasma source for standard molecular beam epitaxy equipment, Rev. Sci. Instrum. 61(9), Sep. 1990, pp. 2407–2411.

Primary Examiner—R. Bruce Breneman
Assistant Examiner—Byron Everhart
Attorney, Agent, or Firm—Choate, Hall & Stewart

[57] ABSTRACT

This invention relates to a method of preparing highly insulating GaN single crystal films in a molecular beam epitaxial growth chamber. A single crystal substrate is provided with the appropriate lattice match for the desired crystal structure of GaN. A molecular beam source of Ga and source of activated atomic and ionic nitrogen are provided within the growth chamber. The desired film is deposited by exposing the substrate to Ga and nitrogen sources in a two step growth process using a low temperature nucleation step and a high temperature growth step. The low temperature process is carried out at 100°–400° C. and the high temperature process is carried out at 600°–900° C. The preferred source of activated nitrogen is an electron cyclotron resonance microwave plasma.

27 Claims, 4 Drawing Sheets

METHOD FOR THE PREPARATION AND DOPING OF HIGHLY INSULATING MONOCRYSTALLINE GALLIUM NITRIDE THIN FILMS

This is a continuation of copending application Ser. No. 07/670,692 filed on Mar. 18, 1991, now abandoned.

BACKGROUND OF THE INVENTION

This invention relates to a method of preparing monocrystalline gallium nitride thin films by electron cyclotron resonance microwave plasma assisted molecular beam epitaxy (ECR-assisted MBE). The invention further relates to a method for the preparation of n-type or p-type gallium nitride (GaN) films.

Efforts have been made to prepare monocrystalline GaN because of its potentially useful electrical and optical properties. GaN is a potential source of inexpensive and compact solid-state blue lasers. The band gap for GaN is approximately 3.4 eV, which means that it can emit light on the edge of the UV-visible region. For intrinsic GaN, the carrier concentration, $n_i$, is $5.2 \times 10^3$ cm$^{-3}$, the mobility is 330 cm$^2$V$^{-1}$s$^{-1}$ and the resistivity is $3.6 \times 10^{12}$ $\Omega$-cm.

Despite the desirability of a monocrystalline GaN film, its development has been hampered by the many problems encountered during the growth process. Previous attempts to prepare monocrystalline GaN films have resulted in n-type films with high carrier concentration. The n-type characteristic is attributed to nitrogen vacancies in the crystal structure which are incorporated into the lattice during growth of the film. Hence, the film is unintentionally doped with nitrogen vacancies during growth. Nitrogen vacancies affect the electrical and optical properties of the film.

ECR-assisted metalorganic vapor phase epitaxy gave GaN films that were highly conductive and unintentionally doped n-type (S. Zembutsu and T. Sasaki *J. Cryst. Growth* 77, 25-26 (1986)). Carrier concentrations and mobilities were in the range of $1 \times 10^{19}$ cm$^{-3}$ and 50-100 cm$^2$V$^{-1}$s$^{-1}$, respectively. Efforts to dope the film p-type were not successful. The carrier concentration was reduced by compensation, that is, the effect of a donor impurity is "neutralized" by the addition of an acceptor impurity.

Highly resistive films were prepared by sputtering using an ultra-pure gallium target in a nitrogen atmosphere. The films were characterized n-type and the high resistivity was attributed to the polycrystalline nature of the films (E. Lakshmi, et al. *Thin Solid Films* 74, 77 (1977)).

In reactive ion molecular beam epitaxy, gallium was supplied from a standard effusion cell and nitrogen was supplied by way of an ionized beam. Monocrystalline films were characterized n-type, but higher resistivities of $10^6$ $\Omega$-cm and relatively low carrier concentrations and mobilities ($10^{14}$ cm$^{-3}$ and 1-10 cm$^2$V$^{-1}$s$^{-1}$, respectively) were obtained (R. C. Powell, et al. in "Diamond, Silicon Carbide and Related Wide Bandgap Semiconductors" Vol. 162, edited by J. T. Glass, R. Messier and N. Fujimori (Material Research Society, Pittsburgh, 1990) pp.525-530).

The only reported p-type GaN was a Mg-doped GaN treated after growth with low energy electron beam irradiation. P-type conduction was accomplished by compensation of n-type GaN (H. Amano et al. *Jap. J Appl. Phys.* 28(12), L2112-L2114 (1989)).

Current methods of preparing GaN do not permit control of nitrogen vacancies within the lattice. Thus it has not been possible to prepare intrinsic GaN. Additionally, it is desirable to control the doping process in GaN films, thereby enabling the production of p-n junctions. The present invention presents a method to prepare near-intrinsic monocrystalline GaN films and to selectively dope these films n- or p-type.

SUMMARY OF THE INVENTION

The method according to this invention for preparing highly insulating near-intrinsic monocrystalline GaN films uses ECR-assisted MBE. In a preferred embodiment, a molecular beam source of Ga and an activated nitrogen source is provided within an MBE growth chamber. The desired substrate is exposed to Ga and activated nitrogen. A film is epitaxially grown in a two step process comprising a low temperature nucleation step and a high temperature growth step. The nucleation step preferably occurs by exposure of the substrate to gallium and a nitrogen plasma at a temperature in the range of 100°-400° C. and the high temperature growth step is preferably carded out in the temperature range of 600°-900° C. Preferred substrates include, but are not limited to, (100) and (111) silicon and (0001), (11-20) and (1-102) sapphire, (111) and (100) gallium arsenide, magnesium oxide, zinc oxide and silicon carbide. The preferred source of activated nitrogen species is a nitrogen plasma which can be generated by electron cyclotron resonance microwave plasma or a hot tungsten filament or other conventional methods.

In a preferred embodiment, the nitrogen plasma pressure and Ga flux pressure are controlled, thus preventing the beading of metallic gallium on the film surface and the forming of nitrogen vacancies within the lattice. The Ga flux is preferably in the range of $2.0-5.0 \times 10^{-7}$ torr. There is preferably an overpressure of nitrogen in the growth chamber, more preferably in the range of $10^{-3}$–$10^{-5}$ torr.

In yet another preferred embodiment, the low temperature nucleation step includes exposure of the substrate to Ga and nitrogen for a period of time in the range of 3-15 minutes. A film with a thickness of 200-500 Å is deposited, which is amorphous at the low temperatures of the nucleation step. The amorphous film can be crystallized by heating at 600°-900° C. in the presence of activated nitrogen. Subsequent treatment at higher temperatures, preferably 600°-900° C., results in the epitaxial growth of monocrystalline near-intrinsic GaN film. Preferred thickness of the growth layer is in the range of 0.5-10 $\mu$m.

In another aspect of this invention, the monocrystalline GaN film is preferentially doped n- or p-type. To generate a p-type semiconductor, the MBE growth chamber is equipped with Ga, activated nitrogen and acceptor sources. Acceptor sources include Group II elements such as Be, Zn, Cd, and Ca. The substrate is bombarded with electrons either by applying a positive bias to the substrate surface or a metal grid placed directly in front of the substrate. Conditions for low and high temperature deposition are as described above. Exposing the substrate to Ga, nitrogen and acceptor sources results in a doped GaN film, whereby the acceptor takes on an electron and is incorporated into the lattice as a negatively charged species. A charged acceptor species requires less energy to incorporate into the GaN lattice than a neutral acceptor. To dope the material n-type the substrate is bombarded with positive ions by biasing either the substrate or the grid negatively. Thus, the donor impurities incorporate into the GaN in their charged state. This requires less energy than to incorporate a neutral donor species. Suitable donors include Groups IV and VI elements.

Practice of this invention affords near-intrinsic GaN films with resistivities of up to $10^{10}$ ohms-cm and mobilities of 100 $cm^2V^{-1}s^{-1}$ at 200° C. P-type and n-type semiconductors can be selectively prepared simply by choice of surface or grid bias and impurity source. It is possible to efficiently manufacture p-n junctions using the methods of this invention.

DESCRIPTION OF THE PREFERRED EMBODIMENT

The unintentional doping of GaN has been attributed to the formation of nitrogen vacancies in the GaN lattice. GaN decomposes (and loses nitrogen) at about 650° C., well below the processing temperatures of the above processes (>1000° C). Therefore, the growth process itself provides sufficient thermal energy for vacancy formation. Growth processes at lower temperatures should reduce the number of nitrogen vacancies in the lattice, prevent the unintentional n-type doping of the GaN lattice and result in intrinsic GaN.

The practice of the present invention forms GaN at significantly lower processing temperatures using an activated nitrogen source. An ECR microwave nitrogen plasma is the preferred activated nitrogen source. A two step heating process permits the formation of monocrystalline GaN at lower processing temperatures.

Figure 1:
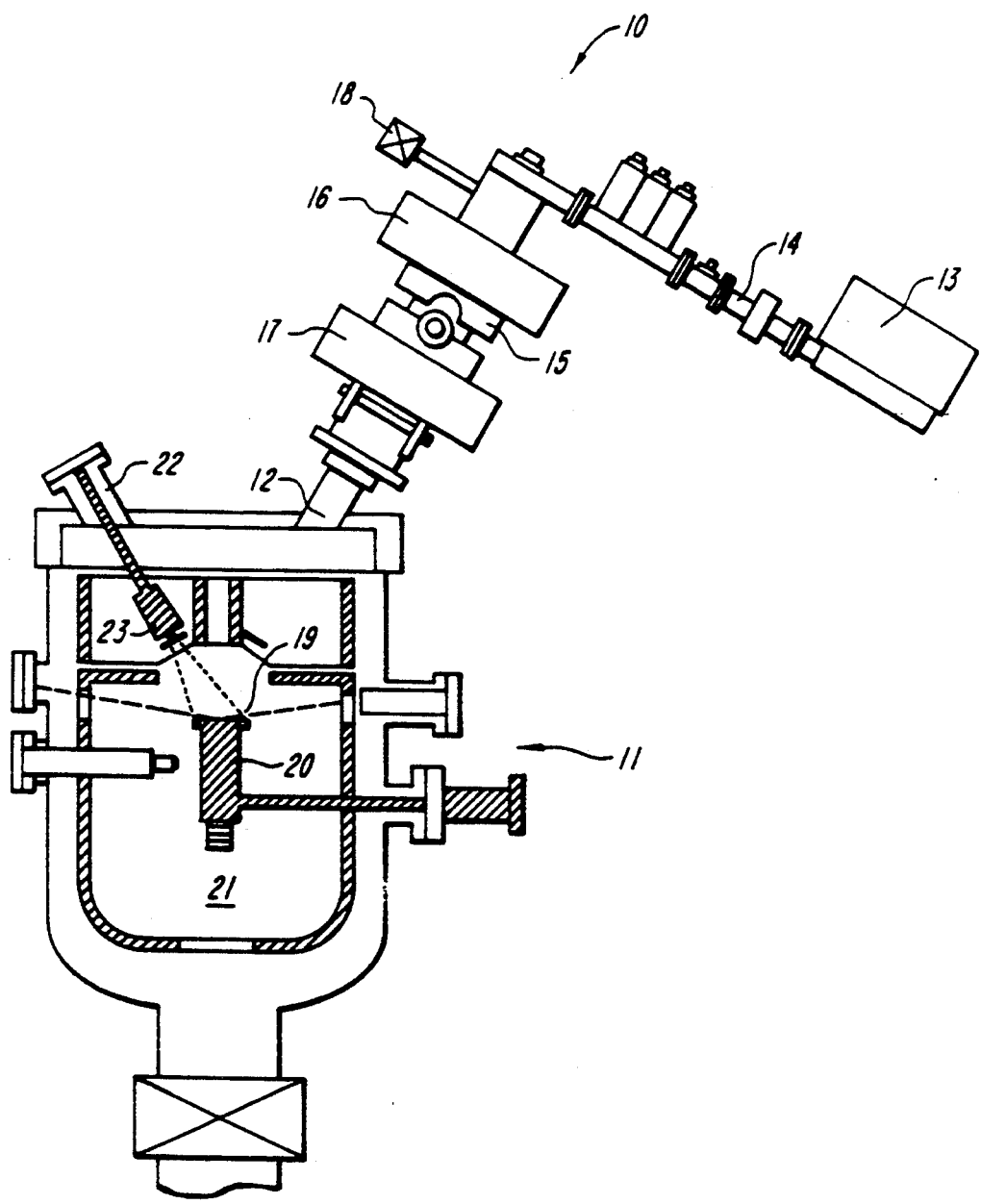
FIG. 1 is a cross-sectional view of an ECR-assisted MBE growth chamber.

The ECR-MBE system used in this invention is shown in FIG. 1. An ECR-system 10 was integrated with an MBE system 11 by attaching the ECR system 10 to an effusion port 12. The ECR system includes a microwave generator 13, a waveguide 14, a high vacuum plasma chamber 15, and two electromagnets 16 and 17. The microwaves at 2.43 GHz are created in the microwave generator 13 and travel down the rectangular waveguide 14. The microwave power (100–500 W) passes from the waveguide 14 into the plasma chamber 15. Nitrogen flows into the plasma chamber 15 through a mass flow controller 18. The mass flow controller 18 maintains an adjustable constant flow rate. The plasma chamber 15 is surrounded by the two electromagnets 16 and 17. The upper magnet 16 is powered by a 2 kW power supply (not shown) and the lower magnet 17 is powered by a 5 kW power supply (not shown). Positioning of the electromagnets in this way results in a more intense and stable plasma.

The upper electromagnet 16 sets the free electrons in the chamber 15 into cyclotron orbits. The cyclotron frequency is dependent upon the strength of the magnetic field and the electron charge-to-mass ratio. Since all the electrons assume cyclotron orbits, the energy lost in random motion and collisions is reduced. Additionally, the plasma will be confined to the center of the chamber 15. The magnetic field is adjusted such that the frequency of oscillation of the microwaves is exactly equal to the cyclotron frequency of the electrons. $N_2$ is then introduced into the chamber through the mass flow controller 18 and is decomposed to high energy atomic and ionic nitrogen species by impact with the high energy electrons. The lower electromagnet 17 then guides the ions through the effusion port 12 towards a substrate 19 which is positioned on a continuous azimuthal rotation (C.A.R.) unit 20 in a growth chamber 21 of the MBE system 11. The C.A.R. 20 can be rotated between 0 and 120 rpm. On certain substrates, GaN films grow in the wurtzitic structure and on others in the zincblende structure. Such substrates include for example sapphire (GaN in wurtzitic structure) and Si(100) (GaN in the zincblende structure). Gallium flux is generated in a Knudsen effusion cell 22.

In a typical process, the substrate 19 was sputter-etched by the nitrogen plasma at 600° C. The substrate was cooled down to 270° C. in the presence of the nitrogen plasma. A Ga shutter 23 was then opened to deposit the initial buffer layer of GaN. The use of an activated nitrogen source permitted the deposition of GaN at this low temperature. The buffer layer was allowed to nucleate over ten minutes and then the Ga shutter 23 was closed to stop the nucleation of the film. The substrate was then brought slowly to 600° C. at the rate of 4° C. every 15 seconds in the presence of the nitrogen plasma. The nitrogen overpressure also helped reduced the formation of nitrogen vacancies.

Once at 600° C., the substrate 19 was kept at this temperature for 30 minutes in the presence of nitrogen plasma to ensure that the GaN buffer layer had crystallized. The Ga shutter 23 was opened once again to grow the GaN monocrystalline film. The thickness of the film was about 1 μm, although in theory there is no limitation to film thickness. Nitrogen pressure and gallium flux are kept constant during the entire process.

The two step growth process allows for the nucleation of a buffer layer. The buffer layer is grown at a temperature in the range of 100°–400° C. Because the temperature is low, the probability of nitrogen vacancy formation is reduced. As the temperature increases to 600° C., the amorphous film crystallizes. Any further growth takes place on the crystallized GaN buffer layer. The films grown by this two step process are superior to those grown by a one step growth process.

Figure 2A:
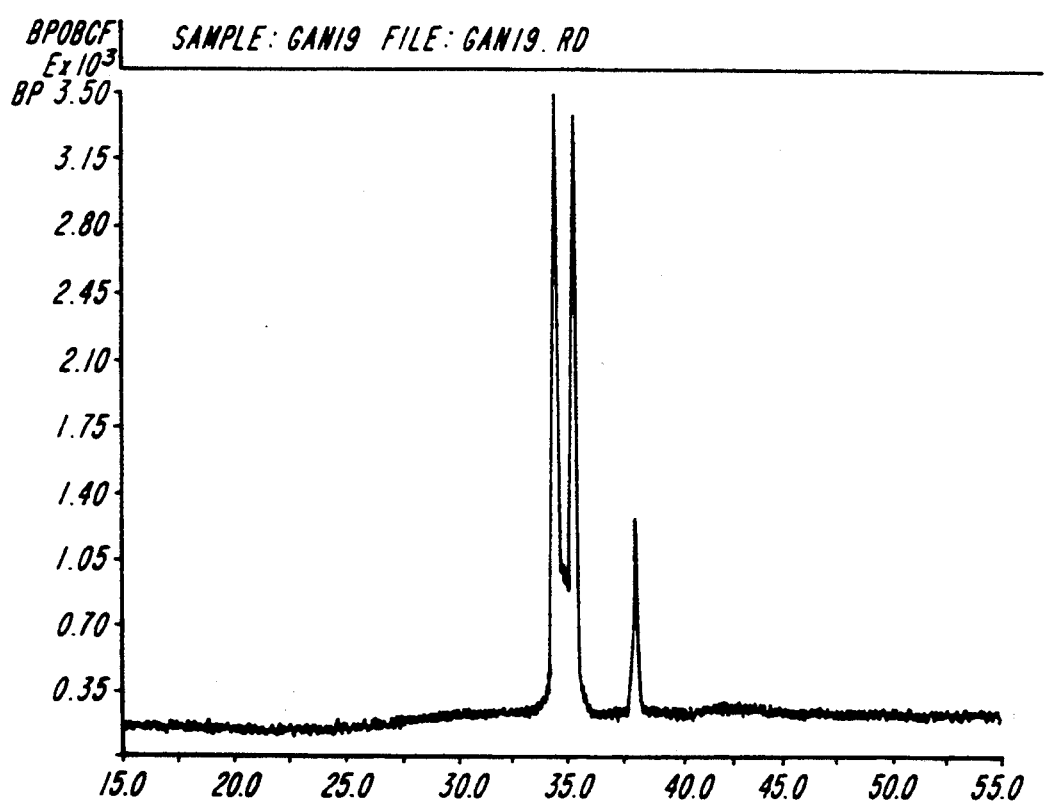
FIG. 2a is a X-ray diffraction pattern from a GaN film on (11-20) sapphire grown from one-step process.
Figure 2B:
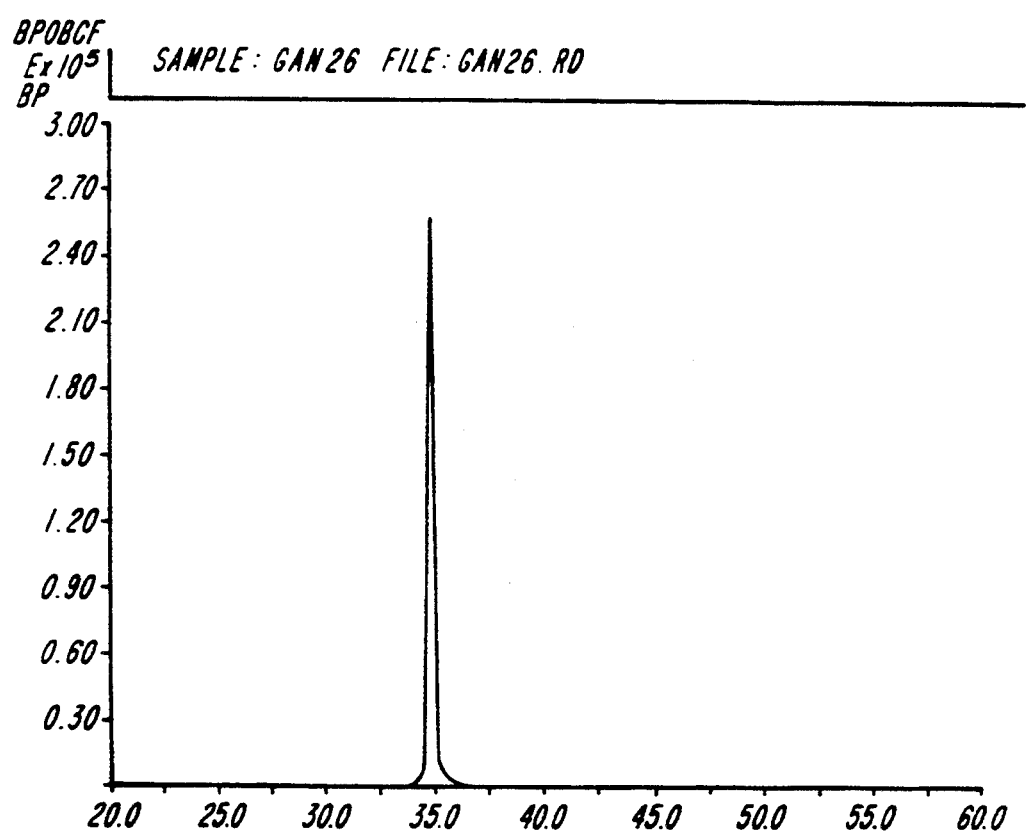
FIG. 2b is an X-ray diffraction pattern from a GaN film on (11-20) sapphire grown from a two-step process.

FIG. 2 shows the X-ray diffraction (XRD) pattern of a GaN film grown on the α-plane of sapphire (11-20) in a one-step process (FIG. 2a) and a two-step process (FIG. 2b). The two peaks at ca. $2°\theta = 35°$ of FIG. 2a are attributed to a defective GaN crystal. FIG. 2b has a single peak indicating a film of better quality. This is because the majority of the film grows on the top of the GaN buffer and does not see the underlying substrate. The growth layer of GaN "recognizes" the GaN buffer layer and on which it can grow without defects. The buffer is the only part of the film which is highly defective.

Films grown by the method described above were highly resistive at room temperature ($10^{10}$ Ω-cm) The mobility of this material is 10 $cm^2V^{-1}s^{-1}$, a reasonable value compared to the theoretic mobility of intrinsic GaN 330 which is Ω-$cm^3$.

Figure 3:
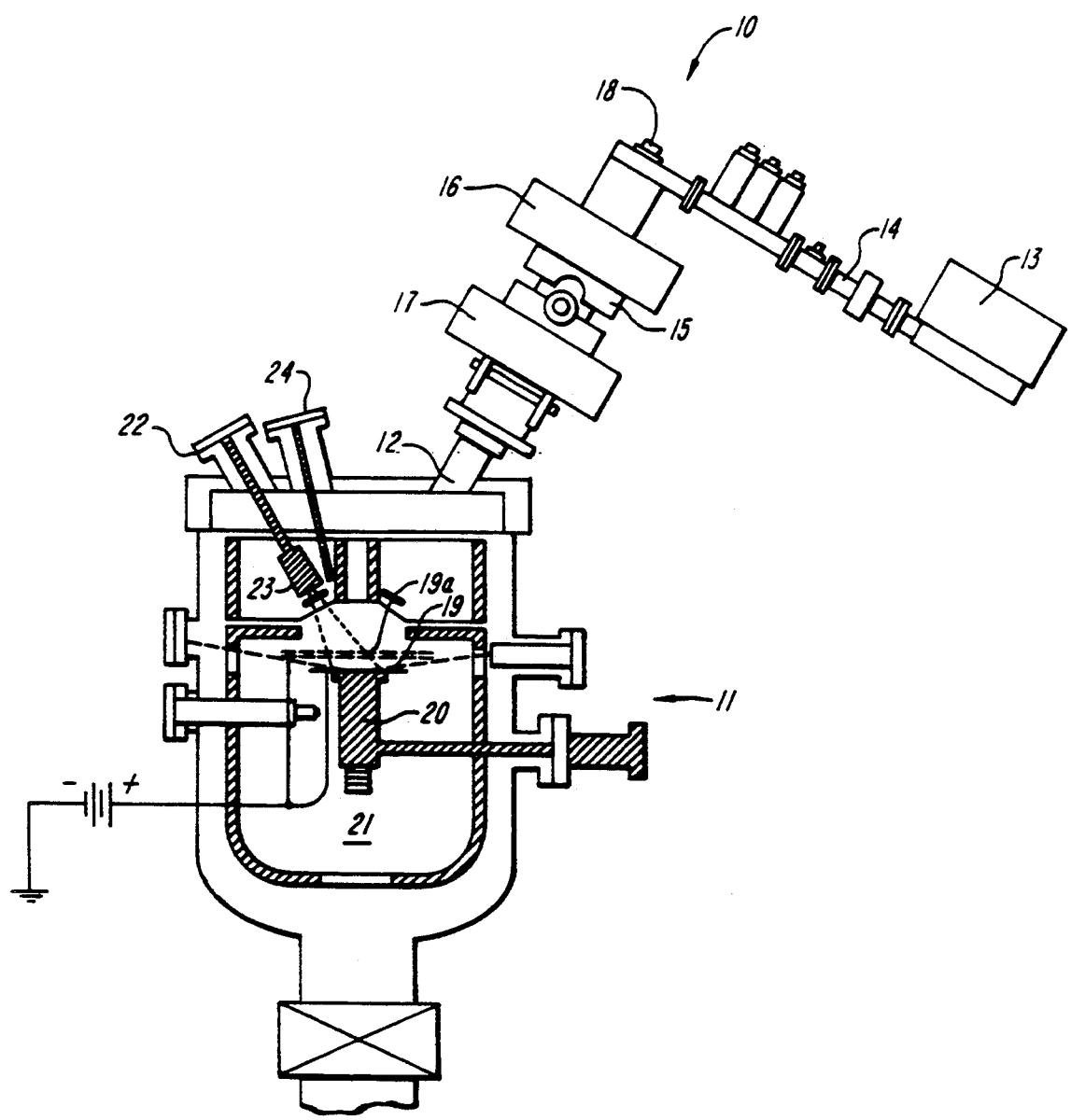
FIG. 3 is a schematic illustration of the method for doping GaN films.

GaN films are doped n-type or p-type by incorporating the proper impurities in their charged state. This is because the energy to incorporate a charged impurity into the lattice is lower than the energy needed to incorporate a neutral impurity. FIG. 3 is a schematic illustration of the doping of a charged acceptor into the GaN lattice. The substrate 19 or a grid 19a directly in front of it is positively biased. FIG. 3 shows both substrate 19 and grid 19a connected to a voltage source. In practice of this invention, either substrate 19 or grid 19a would be positively biased. Electrons are therefore attracted to the substrate surface, while positive ions such as N+ are repelled. The growth process is carried out as described above with addition of an acceptor source 24 so that Ga, nitrogen and acceptor are deposited on the electron-rich surface of the substrate. As the acceptor atom approaches the surface, it takes on an electron and is incorporated into the lattice as a negative species, the energy of incorporation being lower than that of the neutral acceptor species. The same procedure is used to dope the GaN lattice with donor impurities, except that a negative bias is used on the substrate or the grid. Alternately, a charged surface can be generated by bombarding the substrate with electrons or positive ions. Electron guns and ion guns, respectively, are conventional sources of these species.

Suitable acceptor species include, but are not limited to, zinc, magnesium, beryllium, and calcium. Suitable donor species include, but are not limited to, silicon, germanium, oxygen, selenium and sulfur.

What is claimed is:

1. The method of preparing insulating monocrystalline GaN films comprising:
   providing in a molecular beam epitaxial growth chamber, a single crystal substrate with an appropriate lattice match to a zincblende or wurtzite structure of GaN;
   providing a molecular beam Ga source;
   providing an activated nitrogen source; and
   exposing said substrate to said Ga and nitrogen sources to deposit a GaN film using a two-step growth process comprising:
     a low temperature nucleation step during which the substrate is maintained at a temperature between about 100° C. and 400° C. and during which a substantially constant Ga flux pressure and a substantially constant nitrogen pressure is maintained, and
     a high temperature growth step during which the substrate is maintained at a temperature between about 600° C. and 900° C. and during which said substantially constant Ga flux pressure and said substantially constant nitrogen pressure are maintained.

2. The method of preparing doped p-type GaN films comprising:
   providing in a molecular beam epitaxial growth chamber, a single crystal substrate with an appropriate lattice match to a zincblende or wurtzite structure of GaN;
   providing a gallium source, a nitrogen plasma source, and an acceptor source;
   performing a nucleation step by exposing said substrate to said gallium source, maintained at a substantially constant flux pressure, and said nitrogen source, maintained at a substantially constant pressure, at a temperature between about 100° C. and 400° C.; and
   performing a growth step at a temperature between 600° C. and 900° C. to deposit a GaN film on said substrate, comprising:
     positively bias the substrate surface; and
     exposing said surface to said gallium source, maintained at said substantially constant flux pressure, said nitrogen source, maintained at said substantially constant pressure, and said acceptor source to deposit a doped GaN film, whereby said acceptor is in a negatively charged state during said growth step.

3. The method of preparing doped n-type GaN films comprising:
   providing in a molecular beam epitaxial growth chamber, a single crystal substrate with an appropriate lattice match to a zincblende or wurtzite structure of GaN;
   providing a gallium source, a nitrogen plasma source, and a donor source;
   exposing said substrate to said gallium and nitrogen sources in a nucleation step during which the substrate is maintained at a temperature between about 100° C. and 400° C. and during which a substantially constant Ga flux pressure and a substantially constant nitrogen pressure are maintained; and
   performing a growth step at a temperature between 600° C. and 900° C. to deposit a GaN film on said substrate, comprising:
     negatively biasing the substrate surface; and
     exposing said surface to said gallium source, maintained at said substantially constant flux pressure, said nitrogen source, maintained at said substantially constant pressure, and said donor source to deposit a doped GaN film, whereby said donor is in a positively charged state during said growth step.

4. The method of any of claim 1, 2 or 3 wherein said single crystal substrate is (100) silicon or (111) silicon, (11-20) sapphire, (0001) or (1-102) sapphire, (100) gallium arsenide or (111) gallium arsenide, silicone carbide, zinc oxide or magnesium oxide.

5. The method of any of the claims 1, 2 or 3 wherein said gallium source is a Knudsen effusion cell or a metal-organic source.

6. The method of claim 5 wherein said metal-organic source is trimethyl gallium.

7. The method of any of claims 1, 2 or 3 wherein said Ga flux pressure is in the range of about $2.0 \times 5.0 \times 10^{-7}$ torr.

8. The method of any of claim 1, 2 or 3 wherein said activated nitrogen source is a nitrogen or ammonia plasma generated in an electron cyclotron resonance microwave plasma (ECR-source).

9. The method of any of claims 1, 2 or 3 wherein said activated nitrogen source is a nitrogen plasma generated with a hot tungsten filament.

10. The method of any of claims 1, 2 or 3 wherein a nitrogen overpressure is maintained in said growth chamber.

11. The method of claim 8 the nitrogen or ammonia pressure is $10^{-3}$–$10^{-5}$ torr.

12. The method of any of claims 1, 2 or 3 wherein a ratio of said nitrogen pressure to said Ga flux pressure is in the range of $10^2$–$10^4$.

13. The method of any of claims 1, 2 or 3 wherein the activated nitrogen source includes atomic or ionic nitrogen species.

14. The method of claim 8 wherein said ECR-source includes two electromagnets and the stronger of the two electromagnets is used to guide the nitrogen plasma to said substrate.

15. The method of claim 8 wherein the microwave power in said ECR-source is 100–500 W.

16. The method of claim 8 wherein the microwave frequency in said ECR-source is 2.43 GHz.

17. The method of any of claims 1, 2 or 3 wherein said low temperature nucleation step comprises exposure of the substrate to said Ga and nitrogen sources for a period of time in the range of 3–15 minutes.

18. The method of claim 17 wherein a substantially amorphous film of GaN is formed by said nucleation step.

19. The method of claim 18 wherein said film has a thickness in the range of 30–500 Å.

20. The method of claim 18 further comprising the step of crystallizing said amorphous film by heating the substrate to a temperature in the range of 600°–900° C. in the presence of said activated nitrogen source.

21. The method of any of claims 1, 2 or 3 wherein said high temperature growth step deposits said film with a thickness in the range of 0.5 to 10 μm.

22. The method of either of claims 2 or 3 wherein said step of charging the substrate surface comprises electrically biasing a grid placed immediately in front of said substrate.

23. The method of claim 22 wherein said step of charging the substrate surface further comprises providing an electrical ground on the back surface of said substrate surface being charged.

24. The method of claim 2 wherein said step of negatively charging the substrate surface comprises bombarding said surface with electrons from an electron gun.

25. The method of claim 3 wherein said step of positively charging the substrate surface comprises bombarding said surface with positive ions from an ion gun.

26. The method of any of claims 1, 2 or 3 wherein said high temperature growth step comprises maintaining the substrate at a temperature less than 800° C.

27. The method of claim 26 Wherein said high temperature growth step comprises maintaining the substrate at a temperature no greater than 600° C.

* * * * *